US011508556B2

(12) United States Patent
Ikeda et al.

(10) Patent No.: US 11,508,556 B2
(45) Date of Patent: Nov. 22, 2022

(54) PLASMA PROCESSING APPARATUS

(71) Applicant: TOKYO ELECTRON LIMITED, Tokyo (JP)

(72) Inventors: Taro Ikeda, Yamanashi (JP); Tomohito Komatsu, Yamanashi (JP); Jun Nakagomi, Yamanashi (JP); Kei Nagayosi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 242 days.

(21) Appl. No.: 15/981,246

(22) Filed: May 16, 2018

(65) Prior Publication Data

US 2018/0337023 A1 Nov. 22, 2018

(30) Foreign Application Priority Data

May 16, 2017 (JP) .............................. JP2017-097653
Aug. 28, 2017 (JP) .............................. JP2017-163613

(51) Int. Cl.
*H01J 37/32* (2006.01)
*C23C 16/511* (2006.01)
*C23C 16/455* (2006.01)
*H05H 1/46* (2006.01)

(52) U.S. Cl.
CPC ...... *H01J 37/32192* (2013.01); *C23C 16/455* (2013.01); *C23C 16/45563* (2013.01); *C23C 16/45565* (2013.01); *C23C 16/511* (2013.01); *H01J 37/32449* (2013.01); *H05H 1/4615* (2021.05)

(58) Field of Classification Search
USPC .................................. 118/715–733; 156/345
See application file for complete search history.

(56) References Cited

U.S. PATENT DOCUMENTS

| 4,065,369 A | * | 12/1977 | Ogawa .................. B01J 19/126 204/164 |
| 5,575,883 A | * | 11/1996 | Nishikawa ........ H01J 37/32422 156/345.34 |
| 2005/0255257 A1 | * | 11/2005 | Choi ................... H01L 21/0217 427/585 |
| 2008/0254220 A1 | | 10/2008 | Tian et al. |

(Continued)

FOREIGN PATENT DOCUMENTS

| JP | 2007-221116 | 8/2007 |
| JP | 2009-228054 | 10/2009 |

(Continued)

*Primary Examiner* — Ram N Kackar
(74) *Attorney, Agent, or Firm* — Fenwick & West LLP

(57) ABSTRACT

A plasma processing apparatus includes a microwave introducing module provided at a ceiling portion of a processing chamber and configured to introduce a microwave for generating plasma of a gas into the processing chamber; and a plurality of gas supply holes formed at the ceiling portion of the processing chamber and configured to introduce the gas into a plasma processing space. Each of the plurality of gas supply holes includes a fine hole and a cavity that is expanded from the fine hole and opened to the plasma processing space. A diameter of the cavity on the plasma processing space side is 3 mm or more and is ⅛ or less of a wavelength of a surface wave of a microwave in the plasma.

11 Claims, 8 Drawing Sheets

(56) References Cited

U.S. PATENT DOCUMENTS

| | | | |
|---|---|---|---|
| 2010/0170872 A1* | 7/2010 | Hirayama | H01J 37/3222 216/67 |
| 2011/0076401 A1* | 3/2011 | Chao | H01J 37/32091 427/249.16 |
| 2012/0037596 A1* | 2/2012 | Eto | H01J 37/32449 216/67 |
| 2012/0247673 A1* | 10/2012 | Hayashi | C23C 16/503 156/345.33 |
| 2012/0247675 A1* | 10/2012 | Ikeda | H01J 37/32211 156/345.34 |
| 2012/0304932 A1* | 12/2012 | Toriumi | C23C 16/24 118/723 E |
| 2014/0158786 A1* | 6/2014 | Santo | C23C 16/45565 239/1 |
| 2014/0338602 A1* | 11/2014 | Mihara | H01J 37/32449 118/723 R |
| 2015/0170881 A1* | 6/2015 | Komatsu | H01J 37/32211 156/345.34 |
| 2015/0211123 A1* | 7/2015 | Glukhoy | C23C 16/325 118/712 |
| 2016/0126066 A1* | 5/2016 | Yoshikawa | H01J 37/32192 156/345.33 |
| 2016/0177448 A1 | 6/2016 | Ikeda | |

FOREIGN PATENT DOCUMENTS

| | | |
|---|---|---|
| JP | 2012-216823 A | 11/2012 |
| JP | 2016-119325 | 6/2016 |
| KR | 10-2007-0003364 A | 1/2007 |
| KR | 10-2016-0053816 A | 5/2016 |

* cited by examiner

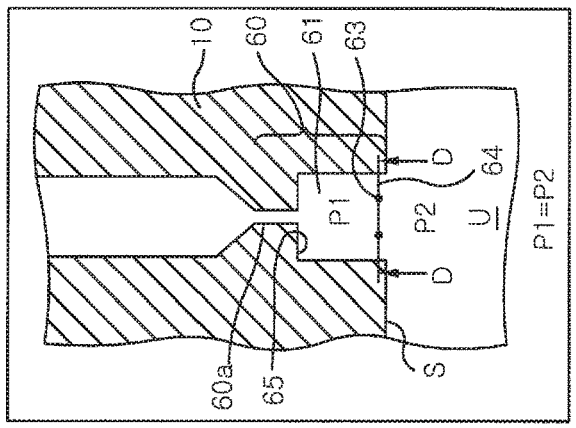
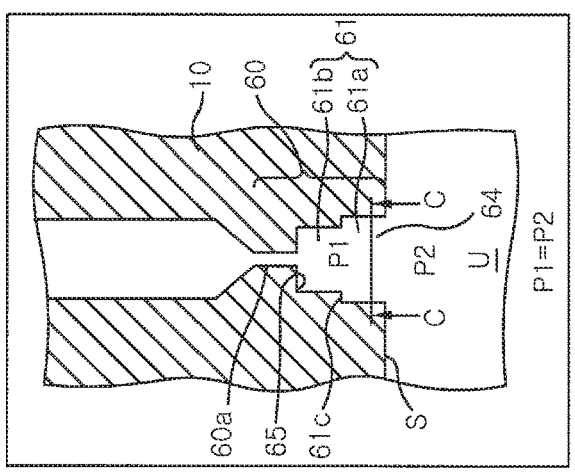
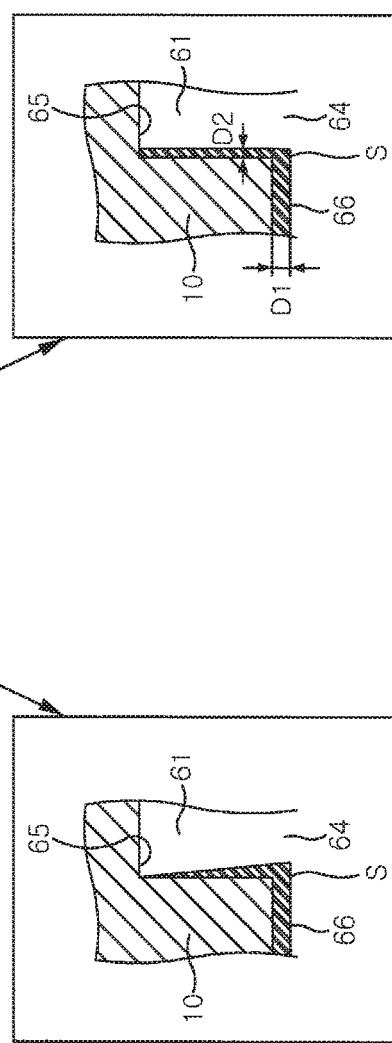
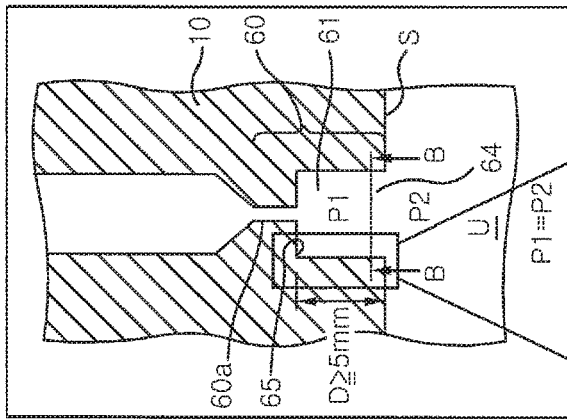
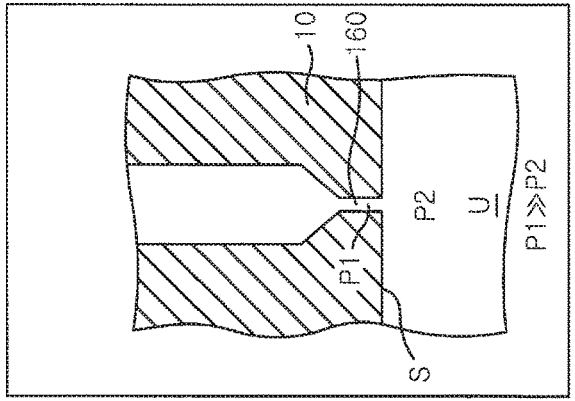

B-B SECTTION

C-C SECTTION

D-D SECTTION

D-D SECTTION

GAS RETENTION POINT

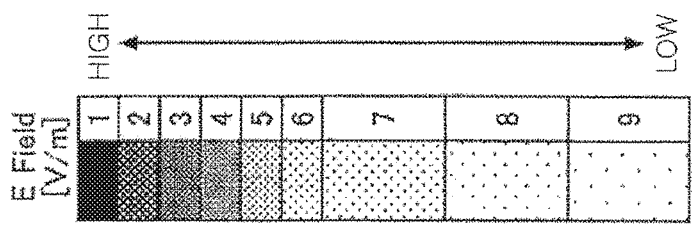
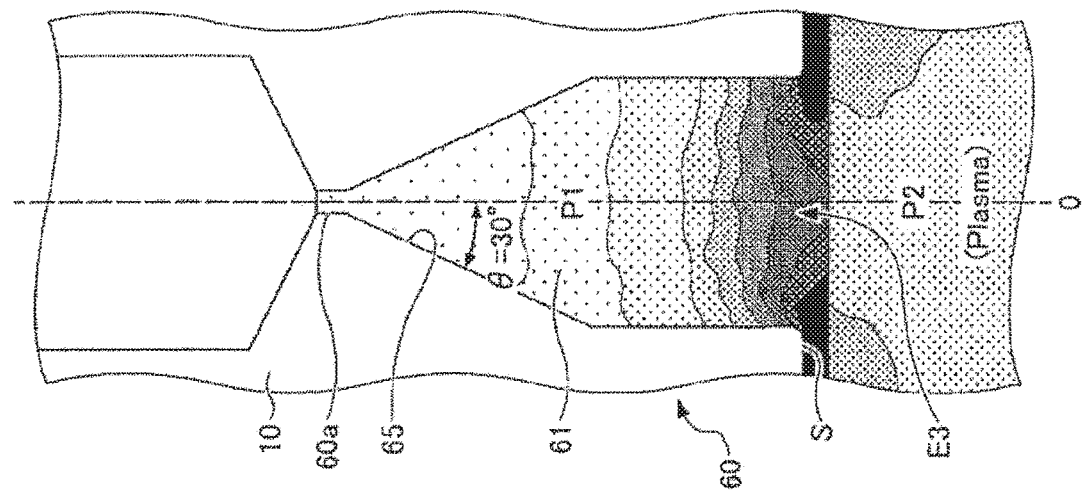
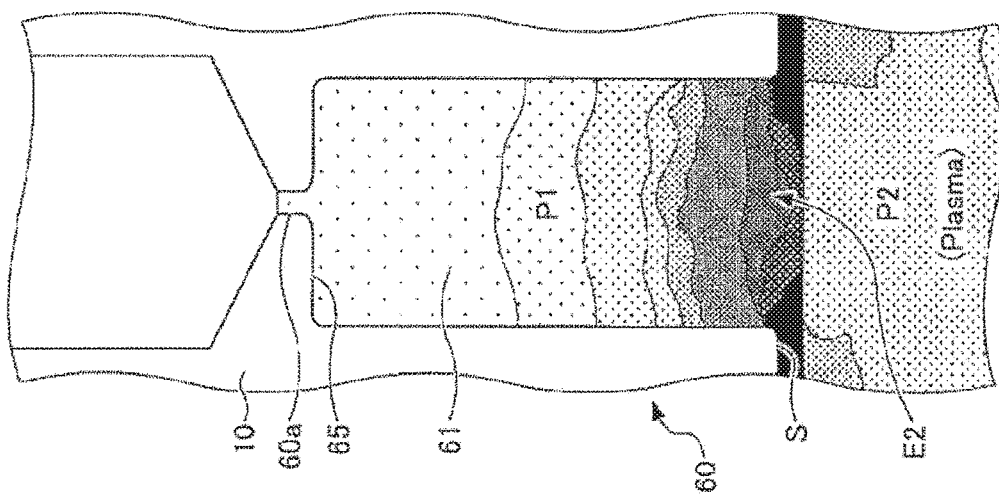
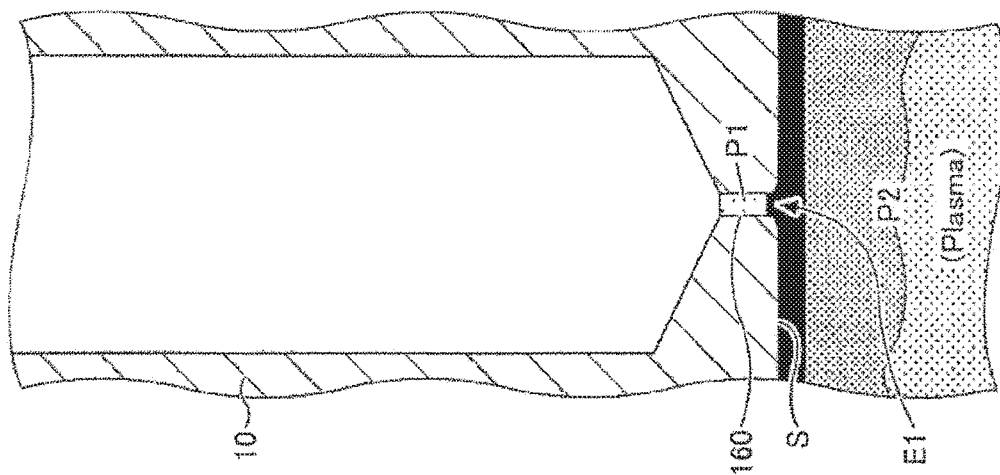
FIG. 7A  FIG. 7B  FIG. 7C

PLASMA PROCESSING APPARATUS

CROSS-REFERENCE TO RELATED APPLICATIONS

This application claims priority to Japanese Patent Application Nos. 2017-097653 and 2017-163613 respectively filed on May 16 and Aug. 28, 2017, the entire contents of which are incorporated herein by reference.

FIELD OF THE INVENTION

The present disclosure relates to a plasma processing apparatus.

BACKGROUND OF THE INVENTION

A plurality of gas supply holes is provided at a ceiling portion of a plasma processing apparatus. Gas is supplied in a shower shape from a gas supply source into the plasma processing apparatus through the gas supply holes (see, e.g., Japanese Patent Application Publication Nos. 2009-228054, 2016-119325 and 2007-221116)

In a microwave plasma processing apparatus, a surface wave of a microwave propagates on a surface (inner wall surface) of the ceiling portion of a chamber to which the microwave is supplied. Therefore, in the microwave plasma processing apparatus, the electric field intensity of the surface of the ceiling portion is increased by the surface wave of the microwave propagating on the surface of the ceiling portion, compared to that in a parallel plate type plasma processing apparatus, e.g., a CCP (Capacitively Coupled Plasma) processing apparatus or the like. Due to the high electric field intensity of the microwave, discharge is likely to occur at the gas supply hole opened on the surface of the ceiling portion. Therefore, arc discharge (abnormal discharge) may occur at the gas supply hole so that the member forming the gas supply hole melts to clog the gas supply hole.

To prevent the abnormal discharge due to the surface wave of the microwave entering the gas supply hole, embedding a porous dielectric material in the gas supply hole and allowing the gas to pass through the porous dielectric material is considered. In that case, however, due to the presence of the porous dielectric material embedded in the gas supply hole, the number of components is increased. Further, due to a process of embedding the porous dielectric material into the gas supply hole and adhering the porous dielectric material to the gas supply hole by baking and bonding it to the ceiling portion, the number of manufacturing processes is increased.

SUMMARY OF THE INVENTION

In view of the above, the present disclosure provides a technique for preventing the occurrence of abnormal discharge in the gas supply hole due to the surface wave of the microwave by optimizing the shape of the gas supply holes.

In accordance with an aspect, there is provided a plasma processing apparatus including: a microwave introducing module provided at a ceiling portion of a processing chamber and configured to introduce a microwave for generating plasma of a gas into the processing chamber; and a plurality of gas supply holes formed at the ceiling portion of the processing chamber and configured to introduce the gas into a plasma processing space, wherein each of the plurality of gas supply holes includes a fine hole and a cavity that is expanded from the fine hole and opened to the plasma processing space, and a diameter of the cavity on the plasma processing space side is 3 mm or more and is ⅛ or less of a wavelength of a surface wave of a microwave in the plasma.

BRIEF DESCRIPTION OF THE DRAWINGS

The objects and features of the present disclosure will become apparent from the following description of embodiments, given in conjunction with the accompanying drawings, in which:

FIGS. 2A, 2B, 2B-1, 2B-2, 2C and 2D show examples of gas supply holes;

FIGS. 3A, 3B, 3C-1 and 3C-2 show examples of openings of the gas supply holes according to the embodiment;

FIGS. 7A, 7B and 7C show examples of a shape of a gas supply hole and an electromagnetic field simulation result;

DETAILED DESCRIPTION OF THE EMBODIMENTS

Figure 1:
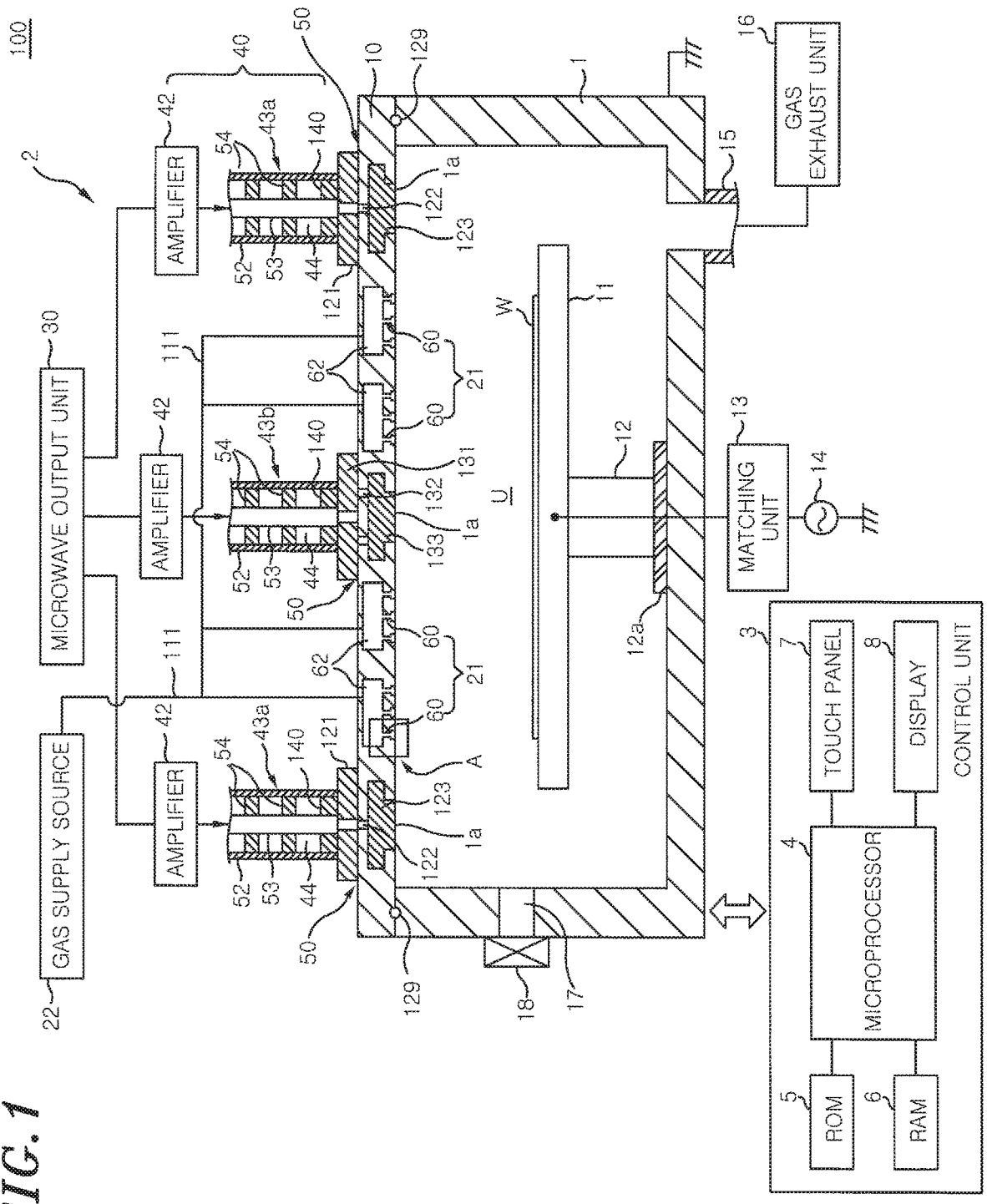
FIG. 1 shows an example of a vertical cross section of a microwave plasma processing apparatus according to an embodiment.

Hereinafter, embodiments will be described with reference to the accompanying drawings. Like reference numerals will be used for substantially like parts throughout the specification and the drawings, and redundant description thereof will be omitted.

(Microwave Plasma Processing Apparatus)

FIG. 1 shows an example of a cross sectional view of a microwave plasma processing apparatus 100 according to an embodiment. The microwave plasma processing apparatus 100 includes a chamber (processing chamber) 1 for accommodating a wafer W. The microwave plasma processing apparatus 100 is an example of a plasma processing apparatus for performing plasma processing on a semiconductor wafer W (hereinafter, referred to as "wafer W") by a surface wave plasma generated on a surface of the chamber 1 by microwaves. The plasma processing may be, e.g., film formation, etching, or the like.

The microwave plasma processing apparatus 100 includes: a microwave introducing module, provided at a ceiling portion of the chamber 1, for introducing microwaves for generating plasma of a gas into the chamber 1; and a plurality of gas supply holes, formed at the ceiling portion of the chamber 1, for introducing the gas into a plasma processing space. Hereinafter, the configuration of the microwave plasma processing apparatus 100 of the present embodiment will be described in detail.

The chamber 1 is a substantially cylindrical airtight processing container made of metal such as aluminum, stainless steel, or the like and is grounded. A main body 10 is a ceiling plate forming the ceiling portion of the chamber 1. The inside of the chamber 1 is airtightly sealed by a support ring 129 provided on a contact surface between an upper portion of the chamber 1 and the main body 10. The main body 10 is made of metal.

A microwave plasma source 2 includes a microwave output unit 30, a microwave transmission unit 40, and a microwave radiation member 50. The microwave plasma source 2 is provided to face the inside of the chamber 1 through a dielectric window 1a formed on an inner wall of the ceiling portion (ceiling plate) of the chamber 1. The microwave output unit 30 distributes and outputs microwaves to a plurality of paths. When the microwaves are introduced into the chamber 1 from the microwave plasma source 2 through the dielectric window 1a, a surface wave plasma is generated in the chamber 1.

A mounting table 11 for mounting thereon the wafer W is provided in the chamber 1. The mounting table 11 is supported by a tubular support member 12 provided at a center of a bottom portion of the chamber 1 through an insulating member 12a. The mounting table 11 and the support member 12 may be made of metal such as aluminum having an alumite-treated (anodically oxidized) surface or the like or an insulating member (ceramic or the like) having therein an electrode for high frequency. The mounting table 11 may be provided with an electrostatic chuck for attracting and holding the wafer W, a temperature control unit, a gas flow path for supplying a heat transfer gas to a backside of the wafer W, and the like.

A high frequency bias power supply 14 is electrically connected to the mounting table 11 via a matching unit 13. By supplying a high frequency power from the high frequency bias power supply 14 to the mounting table 11, ions in the plasma are attracted to the wafer W. The high frequency bias power supply 14 may not be provided depending on the characteristics of the plasma processing.

A gas exhaust line 15 is connected to the bottom portion of the chamber 1, and a gas exhaust unit 16 including a vacuum pump is connected to the gas exhaust line 15. When the gas exhaust unit 16 is driven, the inside of the chamber 1 is exhausted. Accordingly, a pressure in the chamber 1 is rapidly decreased to a predetermined vacuum level. Provided on a sidewall of the chamber 1 are a loading/unloading port 17 for loading/unloading the wafer W and a gate valve 18 for opening/closing the loading/unloading port 17.

The microwave transmission unit 40 transmits the microwave output from the microwave output unit 30. The microwave transmission unit 40 includes a peripheral microwave introducing mechanism 43a and a central microwave introducing mechanism 43b having a function of introducing the microwave outputted from an amplifier 42 to the microwave radiation member 50 and a function of matching an impedance.

In the microwave radiation member 50 of the present embodiment, six dielectric layers 123 corresponding to six peripheral microwave introducing mechanisms 43a are arranged at a regular interval in a circumferential direction in the main body 10, and six dielectric windows 1a are exposed in a circular shape to the inside of the chamber 1.

One dielectric layer 133 corresponding to the central microwave introducing mechanism 43b is provided at the center of the main body 10, and one dielectric window 1a is exposed in a circular shape to the inside of the chamber 1. The central microwave introducing mechanism 43b is provided at the center of the main body portion 10 and spaced apart from the six peripheral microwave introduction mechanisms 43 by the same distance.

In each of the peripheral microwave introducing mechanism 43a and the central microwave introducing mechanism 43b, a cylindrical outer conductor 52 and a rod-shaped inner conductor 53 inserted therein are coaxially arranged. A microwave transmission path 44, to which a microwave power is supplied and through which microwaves propagate toward the microwave radiation member 50, is formed between the outer conductor 52 and the inner conductor 53.

Each of the peripheral microwave introducing mechanism 43a and the central microwave introducing mechanism 43b is provided with slugs 54 and an impedance control member 140 provided at a leading end thereof. An impedance of a load (plasma) in the chamber 1 is matched with a characteristic impedance of a microwave power supply in the microwave output unit 30 by moving the slug 54. The impedance control member 140 is made of a dielectric material and controls an impedance of the microwave transmission path 44 by a relative dielectric constant thereof.

The microwave radiation member 50 is provided at the main body 10. The microwaves outputted from the microwave output unit 30 and transmitted through the microwave transmission unit 40 are radiated into the chamber 1 from the microwave radiation member 50.

The microwave radiation member 50 has a dielectric top plate 121 or 131, slots 122 or 132, and a dielectric layer 123 or 133. The dielectric top plate 121 is provided above the main body 10 to correspond to each of the peripheral microwave introducing mechanisms 43a and the dielectric top plate 131 is provided above the main body 10 to correspond to the central microwave introducing mechanism 43b. The dielectric top plates 121 and 131 are disc-shaped dielectric members that transmit microwaves. The dielectric top plates 121 and 131 have a relative dielectric constant greater than that of vacuum. The dielectric top plates 121 and 131 may be made of ceramic such as quartz, alumina ($Al_2O_3$) or the like, a fluorine-based resin such as polytetrafluoroethylene or the like, a polyimide-based resins, or the like. The dielectric top plates 121 and 131 are made of a material whose relative dielectric constant is greater than that of vacuum. Accordingly, a size of an antenna having the slots 122 or 132 can be reduced by making a wavelength of the microwave passing through the dielectric top plate 121 or 131 shorter than a wavelength of the microwave propagating in the vacuum.

Under the dielectric top plate 121, the dielectric layer 123 is fitted into the opening of the main body 10 with the slot 122 formed in the main body 10 between the dielectric top plate 121 and the dielectric layer 123. Under the dielectric top plate 131, the dielectric layer 133 is fitted into the opening of the main body 10 with the slots 132 formed in the main body 10 between the dielectric top plate 131 and the dielectric layer 133.

The dielectric layers 123 and 133 serve as dielectric windows for uniformly generating a surface wave plasma of the microwave on an inner surface of the ceiling portion. Similarly to the dielectric top plates 121 and 131, the dielectric layers 123 and 133 may be made of, e.g., quartz, ceramic such as alumina ($Al_2O_3$) or the like, a fluorine-based resin such as polytetrafluoroethylene, a polyimide-based resin, or the like.

In the present embodiment, the number of the peripheral microwave introducing mechanisms 43a is six. However, it is not limited thereto, and N-number of the peripheral microwave introducing mechanisms 43a may be arranged. N may be 1 or 2, and may be preferably 3 or more, e.g., 3 to 6. The microwave radiation member 50 is an example of N-number of microwave introducing modules that are arranged in the circumferential direction of the main body 10 forming the ceiling portion of the chamber 1 and configured to introduce microwaves for generating a plasma into the processing chamber. A gas inlet 21 of a shower structure is formed at a metal portion of the main body 10. A gas supply source 22 is connected to the gas inlet 21. A gas is supplied from the gas supply source 22 into a gas diffusion space 62 through a gas supply line 111 and then supplied in a shower shape into the chamber 1 through the gas inlet 21. The gas inlet 21 is an example of a gas shower head for supplying a gas through a plurality of gas supply holes 60 formed in the ceiling portion of the chamber 1. The gas may be a gas for plasma generation, e.g., Ar gas or the like, or a gas to be decomposed by high energy, e.g., $O_2$ gas, $N_2$ gas or the like.

The respective components of the microwave plasma processing apparatus 100 are controlled by a control unit 3. The control unit 3 includes a microprocessor 4, a ROM (Read Only Memory) 5, and a RAM (Random Access Memory) 6. The ROM 5 and the RAM 6 store therein a process sequence and a process recipe that is a control parameter of the microwave plasma processing apparatus 100. The microprocessor 4 controls the respective components of the microwave plasma processing apparatus 100 based on the process sequence and the process recipe. The control unit 3 includes a touch panel 7 and a display 8 and allows input, display of results or the like in performing predetermined control based on the process sequence and the process recipe.

When plasma processing is performed in the microwave plasma processing apparatus 100 configured as described above, first, the wafer W held on a transfer arm is loaded into the chamber 1 through the opened gate valve 18 and the loading/unloading port 17. The gate valve 18 is closed after the wafer W is loaded. When the wafer W reaches a position above the mounting table 11, the wafer W is transferred from the transfer arm to a pusher pin and then mounted on the mounting table 11 as the pusher pin is lowered. A pressure in the chamber 1 is maintained at a predetermined vacuum level by the gas exhaust unit 16. A gas is introduced in a shower shape into the chamber 1 from the gas inlet 21. The microwave radiated from the microwave radiation member 50 through the peripheral microwave introducing mechanism 43a and the central microwave introducing mechanism 43b propagates on the inner surface of the ceiling portion. The gas is decomposed by a strong electric field of the microwave propagating as a surface wave, and the wafer W is subjected to plasma processing by the surface wave plasma generated near the surface of the ceiling portion on the chamber 1 side. Hereinafter, a space between the ceiling portion of the chamber 1 and the mounting table 11 is referred to as a plasma processing space U.

(Configuration of Gas Supply Hole)

Next, an example of a configuration of the gas supply hole 60 of the gas inlet 21 according to an embodiment will be described with reference to FIGS. 2A to 2D. FIG. 2A shows an example of a gas supply hole 160 of a comparative example. FIG. 2B is an enlarged view of a portion indicated by A in FIG. 1 which shows one of the gas supply holes 60 of the present embodiment.

In the microwave plasma processing apparatus 100 of the present embodiment, the surface wave of the microwave propagates on an inner surface S of the main body 10. Therefore, the electric field becomes strong on the inner surface S of the main body 10.

The gas supply hole 160 of the comparative example shown in FIG. 2A has a diameter of, e.g., 0.3 mm, and a length of, e.g., 1 mm. In this case, on the assumption that a pressure in the gas supply hole 160 is set to P1 and a pressure in the plasma processing space U in the chamber 1 is set to P2, the pressure P1 is considerably higher than the pressure P2. Therefore, in the gas supply hole 160 of the comparative example, abnormal discharge is likely to occur in the gas supply hole 160. When the abnormal discharge occurs in the gas supply hole 160, the member forming the gas supply hole 160 melts and the gas supply hole 160 may be clogged.

Therefore, in the present embodiment, the occurrence of abnormal discharge in the gas supply hole 60 by the surface wave of the microwave is prevented by optimizing the shape of the gas supply hole 60. Specifically, as shown in FIG. 2B, the gas supply hole 60 of the present embodiment has at a leading end thereof a cavity 61 that is expanded from a fine hole 60a of the gas supply hole 60 and opened to the plasma processing space U. The fine hole 60a of the gas supply hole 60 has a diameter of, e.g., 0.3 mm, and a length of, e.g., 1 mm. A depth D of the cavity 61 from an opening 64 of the cavity 61 on the plasma processing space U side to a bottom portion 65 of the cavity 61 is 5 mm or more. The cavity 61 has a cylindrical shape. However, the cavity 61 is not necessarily formed in a cylindrical shape and may also be formed in a prismatic shape having a polygonal bottom surface such as a quadrilateral bottom surface, a pentagonal bottom surface or the like.

Figure 3A:
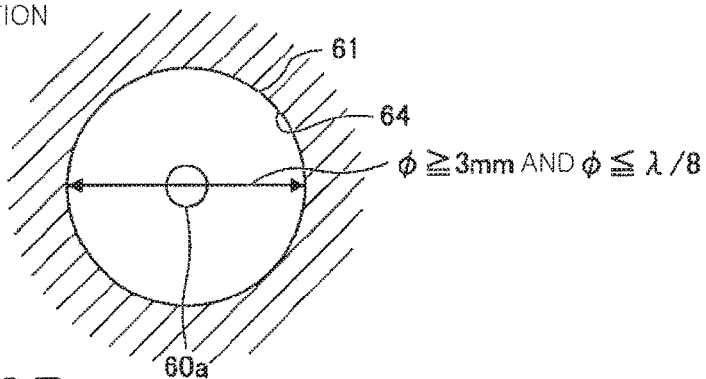

Referring to FIG. 3A showing an example of a cross section of the opening 64 which is taken along a line B-B in FIG. 2B, the opening 64 has a diameter $\varphi$ of 3 mm or more which is ⅛ or less of a wavelength $\lambda$ of the surface wave of the microwave in the plasma.

The wavelength $\lambda$ of the surface wave of the microwave in the plasma is about ⅓ of a wavelength $\lambda_0$ of the microwave in the vacuum. Since the wavelength $\lambda_0$ used in the microwave plasma processing is about 120 mm to 480 mm, the wavelength $\lambda$ of the surface wave of the microwave in the plasma is about 40 mm to 160 mm. Therefore, the opening 64 has a diameter $\varphi$ of 3 mm or more, e.g., 5 mm to 20 mm which is ⅛ of the wavelength $\lambda$ of the surface wave of the microwave in the plasma.

A technical meaning of setting the diameter $\varphi$ of the opening 64 to 3 mm or more and ⅛ or less of the wavelength $\lambda$ of the surface wave of the microwave in the plasma will be described. For example, when the diameter $\varphi$ of the opening 64 is ¼ of the wavelength $\lambda$ of the surface wave of the microwave in the plasma, the surface wave of the microwave stops at the opening 64 and cannot propagate further. In other words, the opening 64 of the cavity 61 prevents the surface wave of the microwave from propagating beyond the opening 64. At this time, the surface wave of the microwave is totally reflected at the opening 64 and, thus, the electric field intensity of the microwave becomes maximum near the opening 64 of the cavity 61. When it exceeds a critical value, arc discharge occurs and this may result in abnormal discharge.

On the other hand, when the diameter $\varphi$ of the opening 64 is ⅛ of the wavelength $\lambda$ of the surface wave of the microwave in the plasma, the surface wave of the microwave can pass through the opening 64. At this time, the surface wave of the microwave does not stop at the opening 64, and a pressure difference between the pressure P1 in the cavity 61 and the pressure P2 in the plasma processing space U is small. Therefore, a strong electric field of the microwave hardly enters the cavity 61, and the occurrence of abnormal discharge in the cavity 61 can be prevented. Accordingly, the diameter $\varphi$ of the opening 64 needs to be ⅛ of the wavelength $\lambda$ of the surface wave of the microwave in the plasma, i.e., 10 mm or less.

When the diameter $\varphi$ of the opening 64 is smaller than 3 mm, although the surface wave of the microwave can pass through the opening 64, the pressure difference between the pressure P1 in the cavity 61 and the pressure P2 in the plasma processing space U is increased. Therefore, it is difficult to prevent occurrence of abnormal discharge in the cavity 61. Accordingly, the diameter φ of the opening 64 of the cavity 61 is set to 3 mm or more. As a consequence, the pressure P1 in the cavity 61 becomes substantially the same as the pressure P2 in the plasma processing space U in the chamber 1, and the pressure difference becomes small. As a result, it is possible to prevent occurrence of abnormal discharge in and around the cavity 61.

Figure 3B:
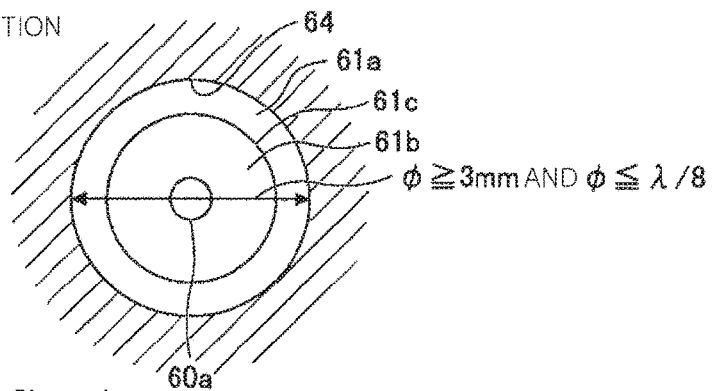
Figures 1, 3C:
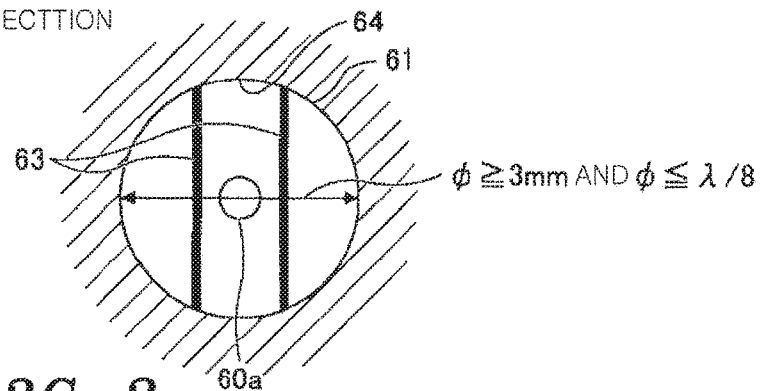
Figures 2, 3C:
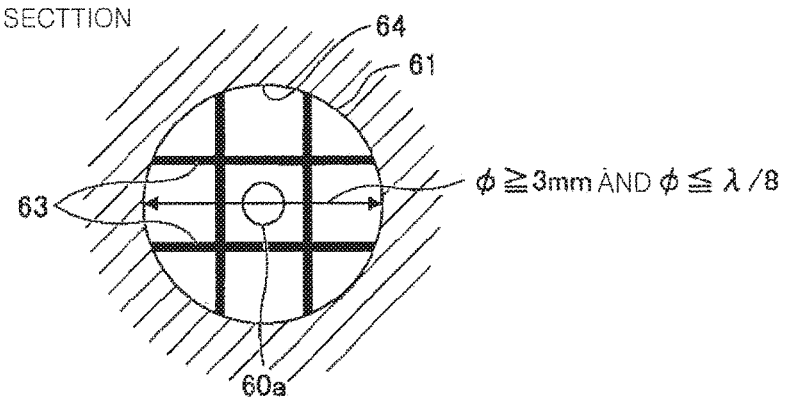

Next, a mechanism of microwave attenuation in the cavity 61 will be described. As shown in FIGS. 2B-1 and 2B-2, at least a bottom portion 65 of the cavity 61 is not coated with an insulating material 66. On the other hand, at least a part of a side portion of the cavity 61 is coated with the insulating material 66. As for the insulating material 66, it is preferable to use yttria ($Y_2O_3$) or alumina ($Al_2O_3$).

As shown in FIG. 2B-1, a sidewall of the cavity 61 may be coated with the insulating material 66 so that the thickness becomes gradually thinner from the opening 64 on the plasma processing space U side toward the bottom portion 65 of the cavity 61. Tbottom portion 65 of the cavity 61 and a portion of the side portion which is close to the bottom portion 65 may not be coated with the insulating material 66.

As shown in FIG. 2B-2, a thickness D2 of the insulating material 66 coated on the sidewall of the cavity may be extremely smaller than a thickness D1 of the insulating material 66 coated on the wall surface of the ceiling portion of the chamber 1. For example, the thickness D2 may be 1/100 or less of the thickness D1.

The microwave propagates through the dielectric material. Therefore, an insulating material 66 such as yttria ($Y_2O_3$) or the like is sprayed on the inner surface S of the ceiling portion of the chamber 1 so that the surface wave of the microwave can easily pass through the inner surface S of the ceiling portion.

As described above, the thickness of the insulating material 66 on the sidewall of the cavity 61 becomes gradually thinner toward the bottom portion 65 of the cavity 61 or becomes extremely thinner than the thickness of the insulating film 66 sprayed on the inner surface S of the ceiling portion. Accordingly, when the surface wave of the microwave propagates toward the bottom portion 65 of the cavity 61, the microwave can be attenuated exponentially.

Further, in the present embodiment, at least the bottom portion 65 of the cavity 61 is not coated with the insulating material 66. In other words, aluminum portion of the main body 10 is exposed at the bottom portion 65 of the cavity 61. Therefore, it is difficult for the surface wave of the microwave to propagate on the bottom portion 65 of the cavity 61. Accordingly, the surface wave of the microwave is attenuated, and the surface wave does not reach the fine hole 60a at the bottom portion 65 of the cavity 61. Even if the surface waver has reached the fine hole 60a, the electric field intensity of the microwave is low. As a result, it is possible to prevent occurrence of abnormal discharge in the fine hole 60a.

As shown in FIG. 2B-1, by gradually reducing the thickness of the insulating material 66 on the sidewall of the cavity 61 toward the bottom portion 65 of the cavity 61, the resistance against the plasma generated in the plasma generation space U can be maintained in the vicinity of the opening 64 of the cavity 61 while preventing occurrence of abnormal discharge in the fine hole 60a.

As described above, each of the plurality of gas supply holes 60 of the present embodiment has the cylindrical cavity 61 at a leading end thereof. The opening 64 of the cavity 61 is 3 mm or more and is ⅛ or less of the wavelength of the surface wave of the microwave in the plasma. Accordingly, the pressure difference between the pressure P1 in the cavity 61 and the pressure P2 in the plasma processing space U in the chamber 1 can be reduced.

Due to the insulating material 66 sprayed into the cavity 61, the surface wave of the microwave is sufficiently attenuated inside the cavity 61 and, thus, the surface wave of the microwave does not reach the fine hole 60a. Even if the surface wave of the microwave has reached the fine hole 60, the attenuation is large and, thus, the electric field intensity of the microwave that has reached the fine hole 60a is low. Accordingly, it is possible to prevent occurrence of abnormal discharge in the fine hole 60a.

By optimizing the shape of the gas supply hole 60, it is possible to prevent the surface wave of microwaves from entering the gas supply hole 60 and causing abnormal discharge. As a consequence, a process window can be extended.

FIG. 2C shows an example of the gas supply hole 60 according to a first modification of the present embodiment. FIG. 3B shows an example of a cross section of the opening 64 which is taken along a line C-C in FIG. 2C. As shown in FIG. 2C, the cavity 61 may have a stepped portion 61c. At this time, the cavity 61 has cylindrical portions 61a and 61b of different diameters. The diameters thereof become smaller from the opening 64 on the plasma processing space U side toward the bottom portion 65. In other words, the diameter of the cylindrical portion 61a is greater than that of the cylindrical portion 61b.

In the configuration of the gas supply hole 60 according to the modification 1 shown in FIG. 2C, the diameter φ of the opening 64 is 3 mm or more. Therefore, the pressure P1 in the hollo portion 61 becomes substantially the same as the pressure P2 in the plasma processing space U in the chamber 1. Accordingly, in the gas supply hole 60, abnormal discharge hardly occurs in the cavity 61.

Further, in the gas supply hole 60 according to the first modification, the surface wave of the microwave is reflected at a corner portion of the stepped portion 61c and hardly propagates further. Therefore, it is difficult for the microwave to reach the bottom portion 65 of the cavity 61, which makes it possible to reliably prevent occurrence of abnormal discharge in the fine hole 60a. A single stepped portion may be formed in the cavity 61, or two or more stepped portions may be formed in the cavity 61. As the number of the stepped portions 61c is increased, the reflection of the surface wave of the microwave occurs at each corner portion and it is more difficult for the microwave to reach the bottom portion 65 of the cavity 61, which is preferable.

FIG. 2D shows an example of the gas supply hole 60 according to a second modification of the present embodiment. FIG. 3C-1 shows an example of a cross section of the opening 64 which is taken along a line D-D in FIG. 2D. As shown in FIG. 2D, in the gas supply hole 60 according to the second modification of the present embodiment, metal members 63 are provided at the opening 64 of the cavity 61. The metal members 63 are made of metal wire such as aluminum or the like. As for the metal members 63, any kind of metal wire may be used without being limited to aluminum.

In the configuration of the gas supply hole 60 according to the second modification shown in FIG. 2D, the diameter φ of the opening 64 is 3 mm or more. Therefore, the pressure P1 in the cavity 61 becomes substantially the same as the pressure P2 in the plasma processing space U in the chamber 1. Accordingly, abnormal discharge hardly occurs in the cavity 61.

Further, in the gas supply hole 60 according to the second modification, the metal members 63 are provided at the opening 64. The microwave does not pass through the metal. Therefore, by using the gas supply hole 60 according to the second modification, the metal members 63 function as members for cutting off the electromagnetic wave of the microwave. Accordingly, it is possible to suppress propagation of the microwave into the cavity 61.

As shown in FIG. 3C-1, the metal members 63 may be a plurality of wires for bridging opposite end portions of the opening 64 in the same direction. The metal members 63 may be arranged in a lattice shape as in FIG. 3C-2 showing another example of the cross section of the opening 64 which is taken along the line D-D in FIG. 2D.

In the metal members 63, the number of wires may be changed depending on the size of the opening 64. For example, the opening 64 can be bridged by a single wire, two wires arranged in a cross shape, three wires, or the like. The metal members 63 are not densely formed in a mesh shape or the like but sparsely formed as shown in FIGS. 3C-1 and 3C-2. When the metal members 63 are formed in a mesh shape, particles are generated from the metal members 63 during film formation in the microwave plasma processing apparatus 100 and scatter on the wafer W. The particles cause defects during the plasma processing of the wafer W and deteriorate productivity.

(Configuration of Dielectric Window)

Figure 4:
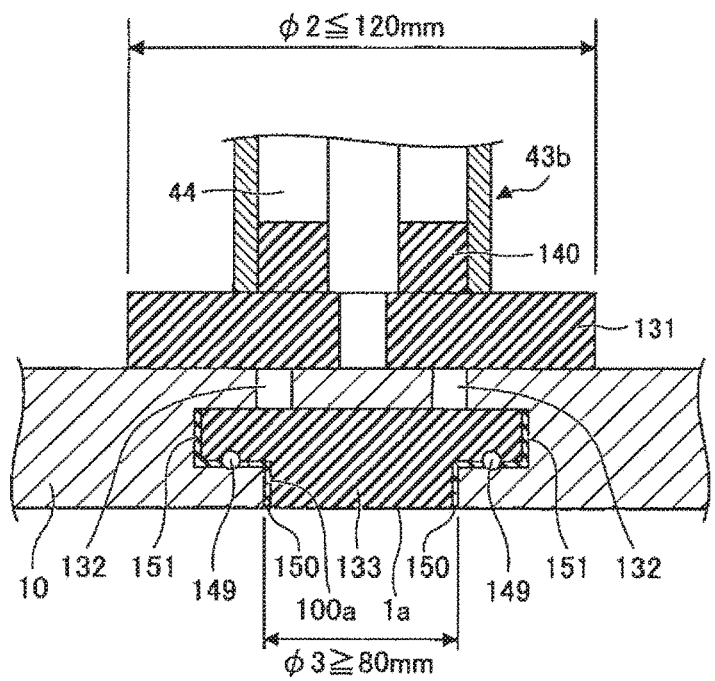
FIG. 4 shows an example of a dielectric window according to an embodiment.

Next, an example of a configuration of the dielectric window 1a according to an embodiment will be described with reference to FIG. 4. FIG. 4 shows an example of the configuration of the dielectric window 1a formed by the dielectric layer 133 under the slots 132 formed in the main body 10 below the central microwave introducing mechanism 43b. However, the dielectric window 1a formed by the dielectric layer 123 under the slot 122 formed in the main body 10 below the peripheral microwave introducing mechanism 43a has the same configuration. Therefore, in the following, the configuration of the dielectric window 1a below the central microwave introducing mechanism 43b shown in FIG. 4 will be described and description of the same configuration of the dielectric window 1a of the peripheral microwave introducing mechanism 43a will be omitted.

The dielectric layer 133 is downwardly protruded and blocks the opening 100a of the main body 10 of the chamber 1 from the outside. The dielectric layer 133 of the present embodiment has a disc shape. An O-ring 149 at the peripheral portion of the dielectric layer 133 seals the gap between the opening 100a of the main body 10 and the dielectric layer 133. A portion 150 of the dielectric layer 133 which is positioned at the outer side (plasma generation space U side) of the O-ring 149 is coated with a fluorine-based resin of PTFE (polytetrafluoroethylene) and allows the contact between the dielectric layer 133 and the main body 10. Accordingly, it is possible to prevent occurrence of abnormal discharge in the gap between the dielectric layer 133 and the opening 100a of the main body 10. A portion 151 of the chamber which is positioned at the inner side of the O-ring 149 and the entire inner wall of the chamber 1 are coated with yttria ($Y_2O_3$).

In order to generate a desired plasma, a diameter $\varphi 2$ of the dielectric top plate 131 is set to 120 mm or less, and a diameter $\varphi 3$ of the opening 100a of the chamber 1 is set to 80 mm or more. The reason why the diameter $\varphi 2$ of the dielectric top plate 131 is set to 120 mm or less is because mode jump of the microwave occurs when the diameter $\varphi 2$ of the dielectric top plate 131 required to have a large size enough to ensure sealability of the chamber 1 exceeds 120 mm, which is not preferable.

The reason why the diameter $\varphi 3$ of the opening 100a of the chamber 1 is set to 80 mm or more is that the power distribution of the dielectric layer 133 deteriorates when the diameter $\varphi 3$ is smaller than 80 mm.

(Modification of Cavity)

Figure 5:
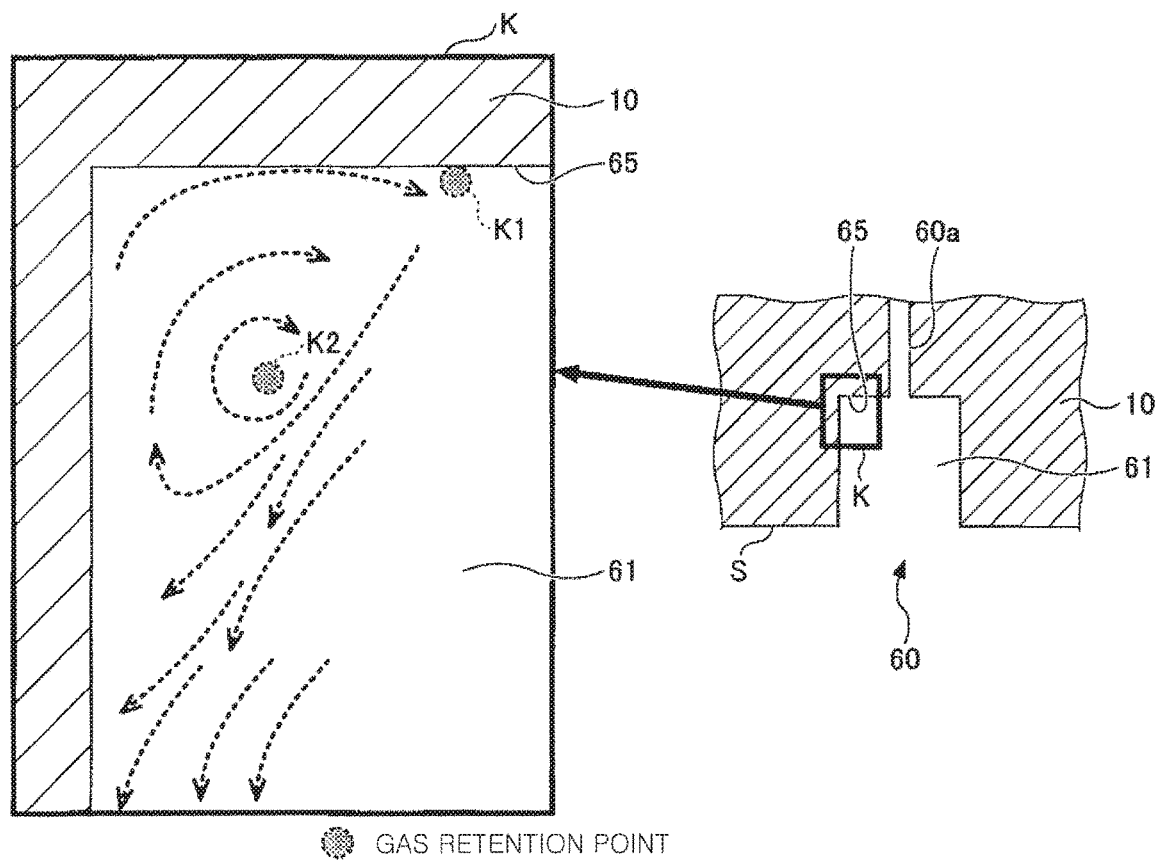
FIG. 5 explains gas flow in a cavity according to an embodiment.

Next, a modification of the cavity 61 will be described with reference to FIGS. 5 to 9. FIG. 5 explains gas flow in the cavity 61 according to an embodiment. The left diagram of FIG. 5 is an enlarged view of a region K of the bottom portion 65 of the cavity 61 shown in the right diagram of FIG. 5. As indicated by arrows in the left diagram of FIG. 5, in the cavity 61, there are gas vortices around gas retention points K1 and K2. The gas existing at and around the retention points K1 and K2 is retained and thus easily reacts with other substances. Substances generated as a result of the reaction cause particles.

Figure 6:
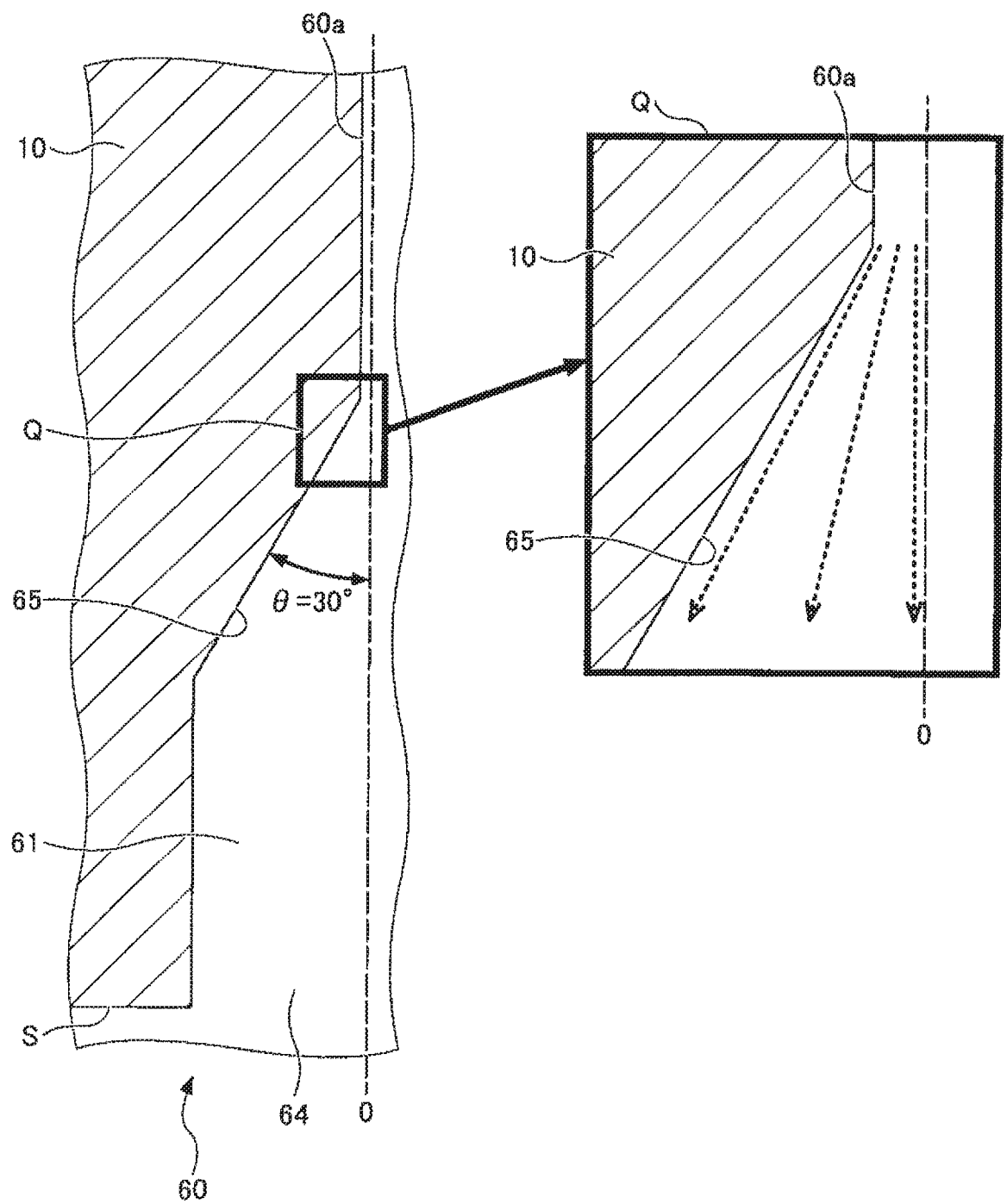
FIG. 6 shows an example of a simulation result of gas flow in a cavity according to a modification.

Therefore, hereinafter, the gas supply hole 60 having the cavity 61 according to the modification which can improve the gas flow will be described with reference to FIG. 6. The right diagram of FIG. 6 is an enlarged view of a region Q of the bottom portion 65 of the cavity 61 shown in the left diagram of FIG. 6.

In the cavity 61 according to the modification, the bottom portion 65 is tapered toward the fine hole 60a. In the example of FIG. 6, an angle of the bottom portion 65 with respect to a central line 0 of the gas supply hole 60 is 30°. In other words, in the present modification, the bottom portion 65 of the cavity 61, which continues to the fine hole 60a is formed in a conical shape in which a cross section of the cavity 61 passing through the central line 0, is tapered at an angle of 60°. The cavity 61 has a cylindrical portion below a conical portion and has a wall surface vertically extending toward the opening 64. In the present modification as well, the diameter of the cavity 61 on the plasma processing space side (the diameter of the opening 64) is 3 mm or more and is ⅛ or less of the wavelength of the surface wave of the microwaves in the plasma.

In the modification, by setting the angle θ of the bottom portion 65 of the cavity 61 with respect to the central line 0 to 30°, the gas from the fine hole 60a flows smoothly to the conical wall surface (the bottom portion 65) of the cavity 61 and, thus, gas vortices are not generated. Accordingly, in the gas supply hole 60 according to the modification, it is possible to prevent substances causing particles from being generated due to gas retention inside the cavity 61. As a result, the process window can be extended. Further, the gas supply hole 60 according to the modification can prevent occurrence of abnormal discharge as in the case of the above embodiment while preventing gas retention.

When the boundary between the conical portion and the cylindrical portion of the cavity 61 according to the modification is formed to be curved, the gas flows more smoothly from the conical portion toward the cylindrical portion of the cavity 61. Therefore, it is structurally difficult for the gas to retain.

FIGS. 7A to 7C show examples of a simulation result of an electromagnetic field generated by the surface wave of the microwave in the gas supply hole 60. FIG. 7A shows an example of a simulation result of an electromagnetic field in the gas supply hole 160 of the comparative example shown in FIG. 2A. FIG. 7B shows an example of a simulation result of an electromagnetic field in the gas supply hole 60 according to the embodiment. FIG. 7C shows an example of a simulation result of an electromagnetic field in the gas supply hole 60 according to the present modification. As shown at the right side of FIGS. 7A to 7C, the electric field intensity in the electromagnetic field has nine levels from 1 (highest) to 9 (lowest).

In the case of the comparative example shown in FIG. 7A, the gas supply hole 160 has a diameter of, e.g., 0.3 mm, and a length of, e.g., 1 mm. In this case, the pressure P1 in the gas supply hole 160 is considerably higher than the pressure P2 in the plasma processing space U in the chamber 1. Therefore, in the comparative example, the electric field E1 of the surface wave of the microwave is abruptly changed from the level 9 to the level 1 at the leading end of the gas supply hole 160. Accordingly, abnormal discharge is likely to occur in the gas supply hole 160.

On the other hand, in the gas supply hole 60 according to the embodiment of FIG. 7B, the pressure difference between the pressure P1 in the cavity 61 and the pressure P2 in the plasma processing space U is small. Therefore, the electric field of the surface wave of the microwave inside the gas supply hole 60 is gradually changed from the level 9 to the level 1. Therefore, the electric field E2 of the surface wave of the microwave is changed gradually at the leading end of the gas supply hole 60. Accordingly, occurrence of abnormal discharge in the cavity 61 can be prevented.

The angle θ of the bottom portion 65 of the cavity 61 in FIG. 7C is 30°. In this case as well, the pressure difference between the pressure P1 in the cavity 61 and the pressure P2 in the plasma processing space U is small. Therefore, the electric field of the surface wave of the microwave inside the gas supply hole 60 is gradually changed from the level 9 to the level 1 similarly to that in the gas supply hole 60 in FIG. 7B. Accordingly, an electric field E3 of the surface wave of the microwave is gradually changed at the leading end of the gas supply hole 60. As a result, occurrence of abnormal discharge in the cavity 61 can be prevented.

Next, the retention of gas in the case of changing the angle of the bottom portion 65 of the cavity 61 from 30° to 45° will be described with reference to FIG. 8.

Figure 8:
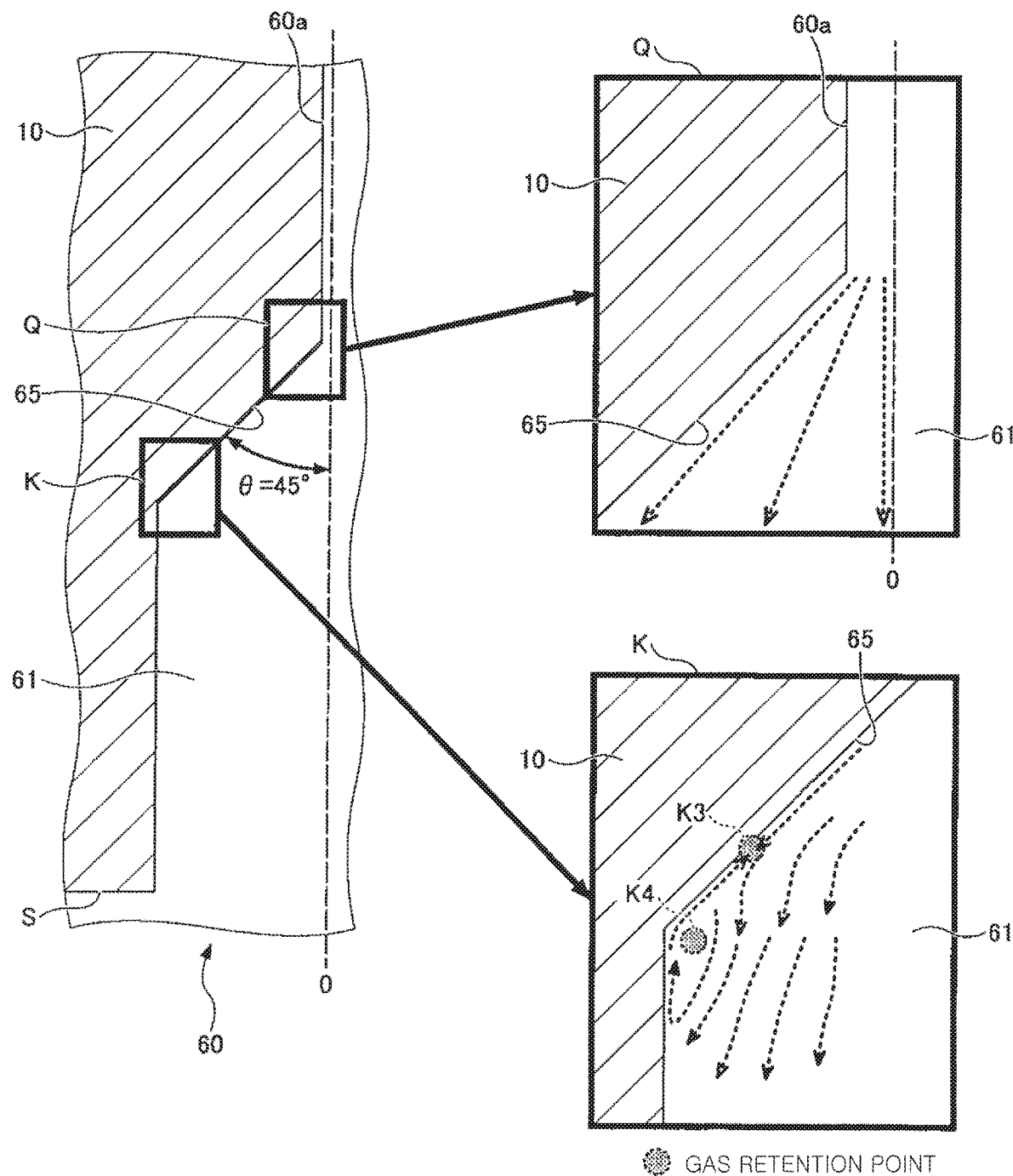
FIG. 8 explains an angle of a bottom portion of a cavity according to a modification and retention of gas.

The upper right diagram of FIG. 8 is an enlarged view of a region Q continuing to the fine hole 60a of the bottom portion 65 of the cavity 61 shown in the left diagram of FIG. 8. The lower right diagram of FIG. 8 is an enlarged view of a region K including an end portion opposite to the region Q of the bottom portion 65 shown in the left diagram of FIG. 8. When the angle θ of the bottom portion 65 of the cavity 61 is 45°, the gas from the fine hole 60a flows smoothly through the conical portion of the cavity 61. However, gas vortices are generated near the boundary between the conical portion and the cylindrical portion. Accordingly, the gas reacts with other substances at and around gas retention points K3 and K4 inside the cavity 61, thereby generating substances causing particles.

From the above, it is clear that when the angle θ of the bottom portion 65 of the cavity 61 is 45°, the gas flow in the cavity portion 61 is not improved. Therefore, it is preferable that the angle θ of the bottom portion 65 of the cavity 61 of the gas supply hole 60 is less than 45° as shown in FIGS. 9A to 9D.

Figure 9A:
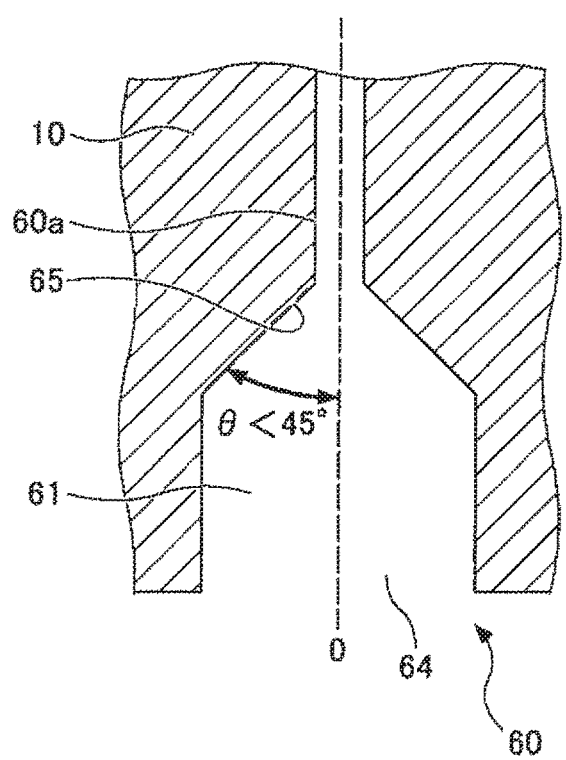
FIGS. 9A, 9B, 9C and 9D show examples of the cavity according to the modification.
Figure 9B:
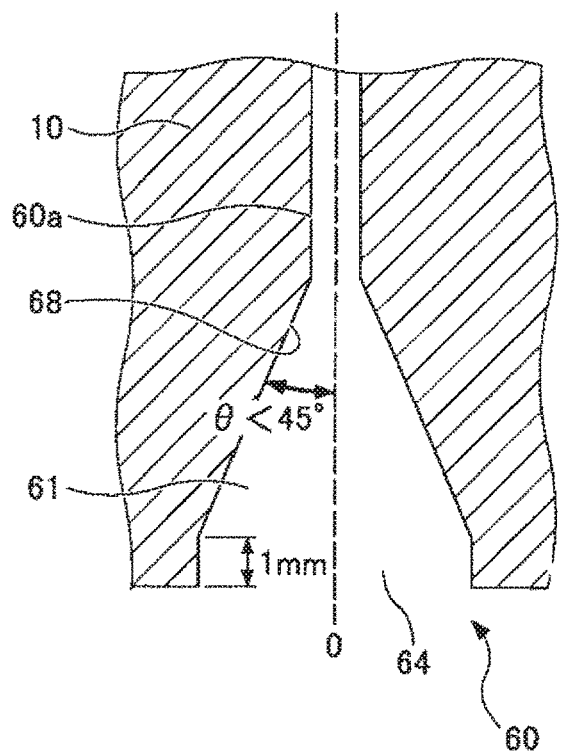
Figure 9C:
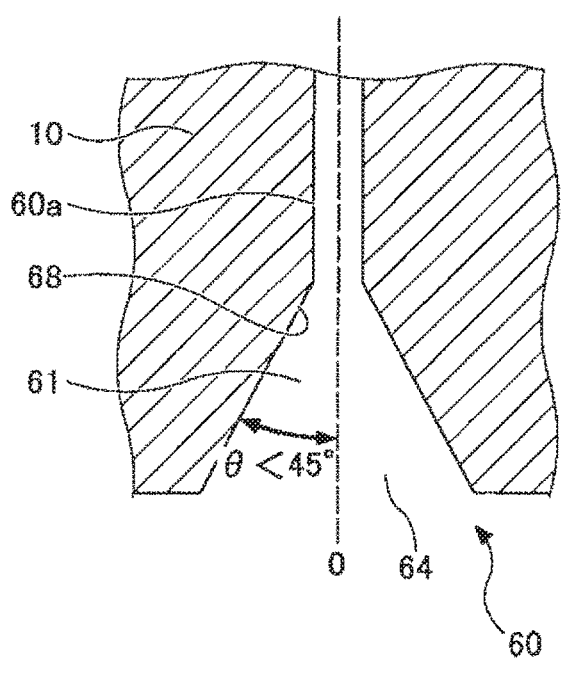
Figure 9D:
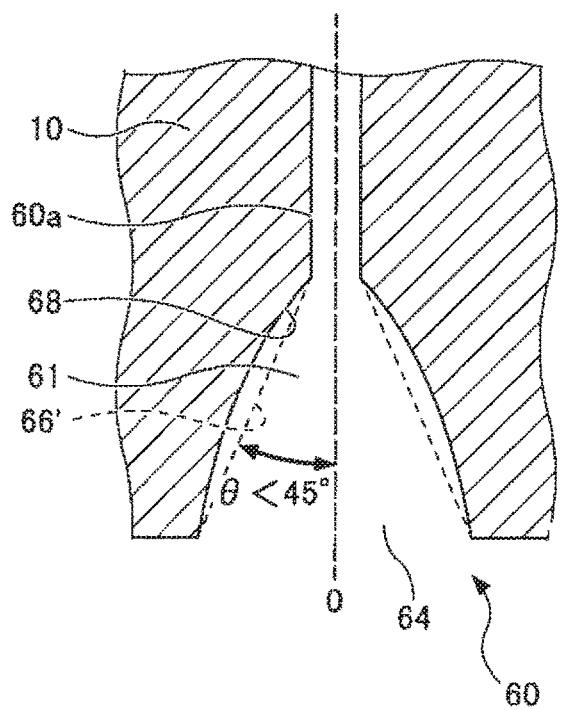

FIG. 9A shows the cavity 61 according to the modification. FIGS. 9B to 9D show examples of the gas supply hole 60 according to another modification. In the gas supply hole 60 of FIG. 9B, the cylindrical portion of the cavity 61 has a height of 1 mm. The angle θ of the opening 64, i.e., an angle formed by a straight line 68 connecting the cylindrical end portion having a height of 1 mm from the opening 64 and the end portion of the fine hole 60a and a central line 0 of the gas supply hole 60, is less than 45°. However, the height of the cylindrical portion of the cavity 61 is not necessarily 1 mm, and may be 1 mm or more, e.g., a few mm.

In the gas supply hole 60 of FIG. 9C, the cavity 61 has a conical portion and does not have a cylindrical portion. In this case, the angle θ of the opening 64, i.e., an angle formed by a straight line 68, which connects the end portion (the opening 64) of the cavity 61 and the end portion of the fine hole 60a and a central line 0 of the gas supply hole 60, i.e., both ends of the conical portion, is less than 45°.

The cavity 61 may have an approximately conical shape or an approximately cylindrical shape in which a wall surface 68 of the cavity 61 is curved outward with respect to a virtual line 66' of FIG. 9D which is the same as the straight line 68 of FIG. 9C that connects the end portion (the opening 64) of the cavity 61 and the end portion of the fine hole 60a. In this case as well, the angle between the virtual line 66' in FIG. 9D and the central line 0 of the gas supply hole 60 is less than 45°.

The wall surface 68 of the cavity 61 may be curved outward as shown in FIG. 9D, but it is not curved inward. If the wall surface 68 is curved inward, the gas introduced into the plasma processing space U from the cavity 61 is easily diffused outward, which makes it difficult to control density distribution of the gas in the plasma processing space U.

It is possible to change the diameter and the angle of at least any one of the gas supply hole 60 formed in the edge region (outer peripheral side of the main body 10), the gas supply hole 60 of the central region (center side of the main body 10), and the gas supply hole 60 in the intermediate region (between the edge region and the central region), among a plurality of gas supply holes 60 formed in the ceiling surface of the main body 10 shown in FIG. 1. Accordingly, the arrangement and the shape of the gas supply hole 60 can be optimized.

For example, by setting the angle θ of the gas supply hole 60 to be different in the above three regions, it is possible to control the gas density distribution in the plasma processing space U. For example, by decreasing the angle θ of the gas supply hole 60, it is possible to make the gas density distribution in the plasma processing space U non-uniform. In addition, by increasing the angle θ of the gas supply hole 60, it is possible to make the gas density distribution in the plasma processing space U uniform.

For example, the diameters of the gas supply holes 60 may be optimized to different sizes in the respective regions. For example, the uniformity of the gas can be improved by decreasing the diameter of the gas supply holes 60 and increasing the number of the gas supply holes 60. In addition, the height of the cavity 61 of the gas supply hole 60 may be changed.

While the embodiments of the plasma processing apparatus have been described, the plasma processing apparatus of the present disclosure is not limited to the above embodiments, and various modifications and improvements can be made within the scope of the present disclosure. The contents described in the above embodiments can be combined without contradicting each other.

In this specification, the semiconductor wafer W has been described as an example of the substrate. However, the substrate is not limited thereto, and it is also possible to use various substrates used for LCD (Liquid Crystal Display), FPD (Flat Panel Display) and the like, a photomask, a CD substrate, a printed board, or the like.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising:
a plurality of microwave radiators provided at a ceiling portion of a processing chamber and configured to introduce a microwave for generating a plasma of a gas into the processing chamber; and
a plurality of gas supply holes formed at the ceiling portion of the processing chamber between the microwave radiators, and configured to introduce the gas into a plasma processing space,
wherein each of the plurality of gas supply holes includes a fine hole and a cavity defined by a first surface parallel to the ceiling portion of the processing chamber, and a second surface forming an angle with respect to the first surface and connected to the ceiling portion of the plasma processing space, and the cavity is concentric with the fine hole,
a diameter of an opening of the cavity on the plasma processing space side is 3 mm or more and is ⅛ or less of a wavelength of a surface wave of a microwave in the plasma,
the ceiling portion of the processing chamber and at least part of the second surface of the cavity is coated with an insulating material, and
the first surface of the cavity is not coated with an insulating material and a thickness of the insulating material coated on the second surface of the cavity is thinner than a thickness of the insulating material coated on the ceiling portion of the processing chamber,
wherein the cavity is coated with an insulating material so that a thickness of the insulating material becomes smaller from the opening of the cavity on the plasma processing space side toward the first surface.

2. The plasma processing apparatus of claim 1, wherein the cavity has a cylindrical shape.

3. The plasma processing apparatus of claim 2, wherein the cavity has one or more stepped portions.

4. The plasma processing apparatus of claim 3, wherein a diameter of the cavity becomes smaller from an opening on the plasma processing space side toward the first surface.

5. The plasma processing apparatus of claim 1, wherein a depth of the cavity from the opening of the cavity on the plasma processing space side to the first surface of the cavity is 5 mm or more.

6. The plasma processing apparatus of claim 1, wherein a thickness of the insulating material coated on the second surface of the cavity is 1/100 or less of the thickness of the insulating material coated on the first surface of the processing chamber.

7. The plasma processing apparatus of claim 1, wherein a metal member is provided at the opening of the cavity on the plasma processing space side.

8. The plasma processing apparatus of claim 1, wherein the first surface is conically shaped, and an angle θ between the first surface and a central line of the cavity is less than 45°.

9. The plasma processing apparatus of claim 8, wherein the second surface is cylindrically shaped.

10. The plasma processing apparatus of claim 9, wherein a height of the second surface is 1 mm or more.

11. The plasma processing apparatus of claim 1, wherein the thickness of the insulating material coated on the second surface of the cavity becomes gradually thinner toward the first surface of the cavity.

* * * * *